(12) United States Patent  
Peterson

(10) Patent No.: US 6,744,144 B2
(45) Date of Patent: Jun. 1, 2004

(54) METHOD AND APPARATUS FOR MARKING MICROELECTRONIC DIES AND MICROELECTRONIC DEVICES

(75) Inventor: Darin L. Peterson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/377,552

(22) Filed: Feb. 27, 2003

(65) Prior Publication Data

US 2003/0157762 A1 Aug. 21, 2003

Related U.S. Application Data

(60) Division of application No. 09/945,315, filed on Aug. 30, 2001, which is a continuation-in-part of application No. 09/605,580, filed on Jun. 28, 2000, now Pat. No. 6,432,796.

(51) Int. Cl.$^7$ ............................................. H01L 23/544
(52) U.S. Cl. ...................................................... 257/797
(58) Field of Search .................................. 257/797, 48

(56) References Cited

U.S. PATENT DOCUMENTS

| | | | |
|---|---|---|---|
| 4,214,249 A | | 7/1980 | Kasai et al. |
| 4,401,992 A | | 8/1983 | Vorst et al. |
| 5,061,341 A | | 10/1991 | Kildal et al. |
| 5,984,190 A | | 11/1999 | Nevill |
| 5,985,377 A | * | 11/1999 | Corbett ........................ 427/511 |
| 6,162,651 A | | 12/2000 | Khosropour |
| 6,175,162 B1 | | 1/2001 | Kao et al. |
| 6,181,017 B1 | * | 1/2001 | Hatchard et al. ............ 257/797 |
| 6,337,122 B1 | * | 1/2002 | Grigg et al. ................. 428/195 |
| 6,432,796 B1 | | 8/2002 | Peterson |
| 6,524,881 B1 | * | 2/2003 | Tandy et al. .................... 438/69 |
| 2002/0076897 A1 | | 6/2002 | Peterson |
| 2002/0168832 A1 | | 11/2002 | Peterson |

* cited by examiner

Primary Examiner—David Nelms
Assistant Examiner—Quoc Hoang
(74) Attorney, Agent, or Firm—Perkins Coie LLP

(57) ABSTRACT

Method and apparatus for marking microelectronic devices, such as bare microelectronic dies and packaged devices, to enhance the identification and automatic handling of wafers, dies and packaged devices. In one embodiment, a microelectronic device comprises a microelectronic die having an integrated circuit, a hidden marking layer superimposed relative to the die, and a cover layer over the hidden marking layer. The hidden marking layer can be applied to a surface of the die and/or a surface of a package encasing at least a portion of the die such that in either situation the hidden marking layer is superimposed relative to the die. In one embodiment, the hidden marking layer is a material that (a) can be removed by a scribing energy (e.g., incinerated or otherwise consumed), and/or (b) is at least partially opaque to an exposure energy. The hidden marking layer can also have a depression defining an identification mark through which at least a portion of the exposure energy can penetrate. The cover layer hides at least a portion of the marking layer over the depression. The cover layer can be a material that is (a) generally not removed or otherwise consumed by the scribing energy, and/or (b) at least partially transmissive to the exposure energy.

30 Claims, 5 Drawing Sheets

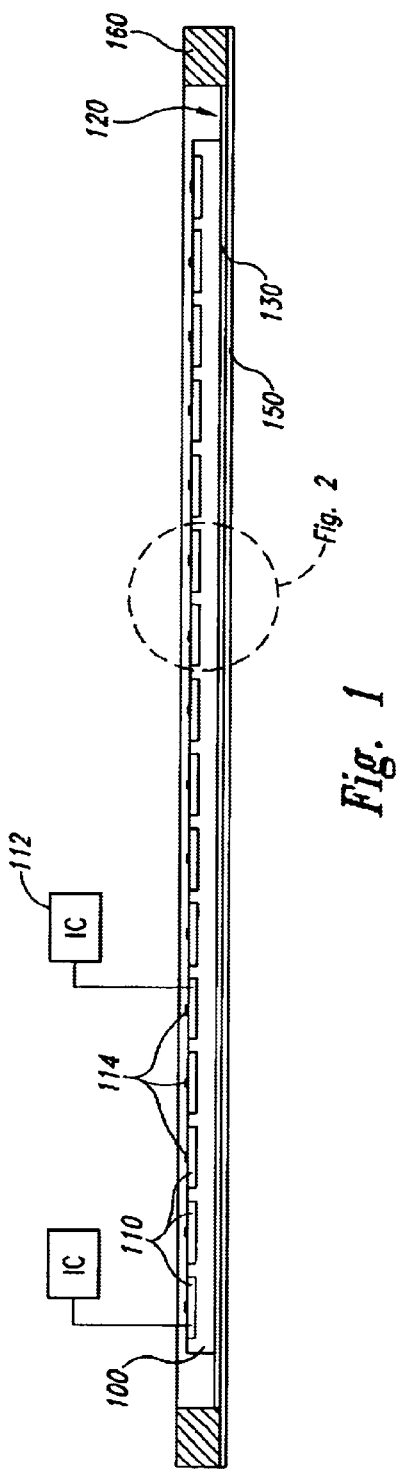
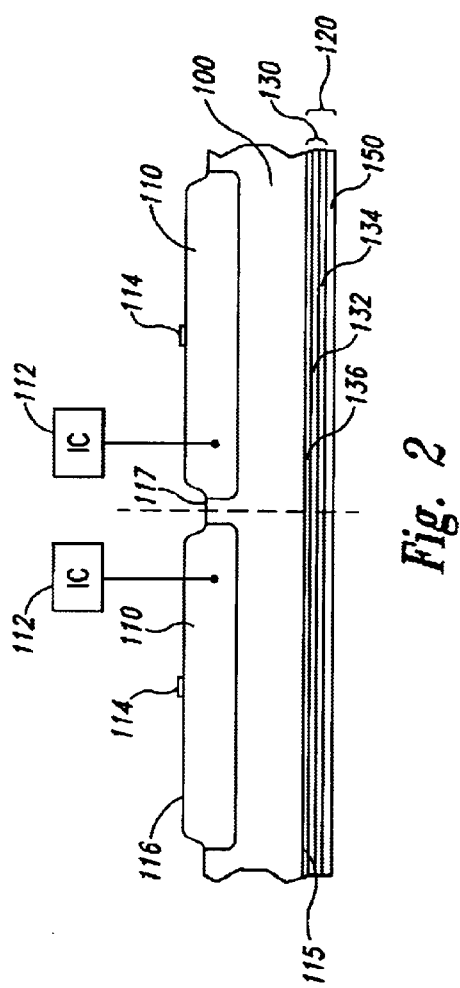

METHOD AND APPARATUS FOR MARKING MICROELECTRONIC DIES AND MICROELECTRONIC DEVICES

CROSS-REFERENCE TO RELATED APPLICATION(S)

This application is a divisional of U.S. Application No. 09/945,315, filed on Aug. 30, 2001, and entitled "Method and Apparatus For Marking Microelectronic Dies and Microelectronic Devices," which application is a continuation-in-part of U.S. Application No. 09/605,580, filed on Jun. 28, 2000, entitled "Method And Apparatus For Marking Microelectronic Dies and Devices," and issued as U.S. Pat. No. 6,432,796, both of which are herein incorporated by reference.

TECHNICAL FIELD

The present disclosure relates to marking microelectronic devices having a microelectronic die including an integrated circuit; more particularly, several aspects of the invention are related to marking packaged microelectronic devices and bare dies used in microelectronic devices.

BACKGROUND

Microelectronic devices, such as memory devices and microprocessors, typically include a microelectronic die or "chip" encased in a plastic, ceramic or metal protective covering. The die can include memory cells, processor circuits, interconnecting circuitry and/or other functional features. The die also typically includes an array of very small bond pads electrically coupled to the functional features. When the die is packaged, the bond pads are coupled to leads, solder ball pads or other types of terminals for operatively coupling the microelectronic dies to buses, circuits and/or other microelectronic devices.

Several different techniques have been developed for packaging microelectronic dies. The dies, for example, can be incorporated into individual protective packages, mounted with other components in a hybrid or multiple chip modules, or connected directly to a printed circuit board. In many packaging applications, the bond pads on the die are coupled to a lead frame or a ball-grid array using wire bonds or by directly pressing the bond pads against contacts. After coupling the bond pads to a lead frame or a ball-grid array, the dies can be covered with plastic, ceramic or other types of protective materials. Dies that are mounted directly to the substrates are generally called Chip Scale Package (CSP) devices or Flip Chip Bare Die devices.

Microelectronic device manufacturers typically fabricate a plurality of dies on a wafer and then cut the wafer to separate the dies from one another. After fabricating the dies, manufacturers generally perform additional operations in which they handle and test (a) wafers having a plurality of dies, (b) individual dies after they have been singulated, and (c) individual dies after they have been packaged. The basic operations that a manufacturer performs after fabricating the dies include backside preparation, die separation, die picking, die inspection, die attachment, wire bonding or flip-chip attachment, preseal inspection, package sealing, plating, trimming, final tests, and other procedures. Throughout several of these procedures the individual dies and the packaged dies are marked with fiducials and identification marks because many of the procedures for packaging the dies are performed by machines that use machine-vision technology to identify and accurately position the dies. Therefore, the fiducials and the identification marks should accordingly be clear, well-defined marks that can be accurately recognized by the machine-vision equipment.

Conventional marking systems for marking bare dies include a laser that changes the color of the silicon on the backside of a die. One conventional marking system specifically uses a laser having a wavelength of 1,064 nm, but other marking procedures alternatively use lasers with a wavelength of 532 nm. Conventional marking systems that use lasers to change the color of the silicon may have many drawbacks.

One drawback of conventional laser marking systems is that the marks on the silicon may not have sufficient clarity to be accurately recognized by the machine vision equipment. As a result, machine-vision devices may not accurately identify or position the dies during a processing operation. Conventional marking systems may accordingly inhibit the processing equipment from effectively working on a die or a package.

Another drawback of conventional laser marking systems is that the lasers may damage the dies. At least one microelectronic device manufacturer has determined that a 1,064 nm laser may damage the integrated circuits on certain dies. Additionally, if other wavelengths of radiation are operated at higher power settings to produce darker marks, then these lasers may also damage the integrated circuitry. Therefore, conventional laser marking systems may damage the dies at the very end of the fabricating process after a considerable amount of time and money has been expended to produce the dies.

Still another drawback of conventional laser marking systems is that it is time consuming to mark bare silicon dies as well as packaged devices. In a typical application, a laser may make the marks at a "scan rate" of a few hundred millimeters per second. Although such scan rates are relatively quick, it may still require a significant amount of time to mark a large number of dies. Therefore, conventional laser marking systems may become a bottleneck for processing and packaging finished dies.

Another aspect of marking dies is to protect manufacturers of genuine microelectronic devices ("genuine parts") from counterfeit parts manufactured by unscrupulous fabricators. Many genuine part manufacturers expend a significant amount of money to research and develop smaller, faster and more reliable devices. Such research and development generally results in proprietary devices, but it may be relatively easy to reverse-engineer the genuine parts. As such, it is relatively common to find counterfeit semiconductor parts that have been copied from the genuine parts. The counterfeit parts often not only have the same components and circuitry as the genuine parts, but they also generally carry the same visible markings and trademarks as the genuine parts. As a result, counterfeit parts are typically passed-off to customers as genuine parts that were produced by a genuine part manufacturer.

Manufacturers of genuine parts accordingly lose a significant amount of revenue because of counterfeit parts that are passed-off as genuine parts. Counterfeit part manufacturers can sell counterfeit parts at lower prices than genuine parts because they do not have large research and development costs. As a result, the genuine part manufacturers typically lose a significant amount of market share to counterfeit parts that are passed-off as genuine parts in the marketplace.

The reputation of a genuine part manufacturer may also be damaged by the passing-off of counterfeit parts. The counterfeit parts are often inferior to the genuine parts because the counterfeit part manufacturers may not use the same materials, manufacturing processes, and/or quality control testing as the genuine part manufacturers. Moreover, the counterfeit part manufacturers typically cut corners because their customers send any warranty claims for failed counterfeit parts to the genuine part manufacturer. The reputation of the genuine part manufacturer accordingly suffers because the poor quality of the failed counterfeit parts is attributed to the genuine part manufacturer. This also increases the costs for a genuine part manufacturer because it typically replaces the faulty counterfeit parts under its warranty. Therefore, it would be desirable to deter the proliferation of counterfeit microelectronic parts to protect the large research and development expenses incurred by genuine part manufacturers.

SUMMARY

The present invention is directed toward marking microelectronic devices to identify and handle wafers, bare dies and packaged devices. The microelectronic devices can be bare dies or packaged dies. In one embodiment, a microelectronic device includes a first exterior surface, a second exterior surface having a contact array with a plurality of contacts, and an integrated circuit coupled to the contacts. The microelectronic device can further include a marking medium applied to the first exterior surface of the device. One embodiment of the marking medium includes a contrast film section having an underlying contrast film applied to the first exterior surface and an outer contrast film attached to the underlying contrast film. Another embodiment of the marking medium can include a contrast film section having only an outer contrast film applied to the first exterior surface of the device. The outer contrast film can have a high optical contrast with respect to the underlying contrast film or the first exterior surface of the device, and the outer contrast film can be changed by a selected radiation so that a portion of the outer contrast film can be selectively removed from the device. The marking medium can optionally include a transfer medium attached to the contrast film section.

Several embodiments of the invention are directed toward methods of marking a microelectronic device having a microelectronic die including an integrated circuit. In one embodiment, a marking method can include applying a marking medium to a surface on either the microelectronic die or a package that encases the microelectronic die. The marking medium can have an outer contrast film that has a high optical contrast with respect to a material immediately under the outer contrast film. This embodiment of the method can also include selectively removing a portion of the outer contrast film to leave a patterned portion on the microelectronic device. The patterned portion of the outer contrast film that is left on the microelectronic device and the material immediately under the outer contrast film define a mark on the microelectronic device.

Several embodiments of the present invention are also directed toward providing a hidden identification mark that can be observed using a selected exposure energy or another type of exposure energy source. One embodiment of a microelectronic device comprises a microelectronic die having an integrated circuit, a hidden marking layer superimposed relative to the die, and a cover layer over the hidden marking layer. The hidden marking layer can be applied to a surface of the die and/or a surface of a package encasing at least a portion of the die such that in either situation the hidden marking layer is superimposed relative to the die. In one embodiment, the hidden marking layer is a material that (a) can be removed by a scribing energy (e.g., consumed, ablated or otherwise displaced), and/or (b) is at least partially opaque and/or reflective to an exposure energy. The hidden marking layer can also have a depression defining an identification mark through which at least a portion of the exposure energy can penetrate. The cover layer hides at least a portion of the marking layer over the depression. The cover layer can be a material that is (a) generally not removed or otherwise displaced by the scribing energy, and/or (b) at least partially transmissive to the exposure energy.

Another embodiment of a microelectronic device having a security feature comprises a microelectronic die having an integrated circuit, a hidden marking layer superimposed over the die, an underlying contrast layer on the marking layer, and an outer contrast layer on the underlying contrast layer. The hidden marking layer can be composed of a material that is removed or otherwise displaced by a scribing energy and is at least partially opaque to an exposure energy. The underlying contrast layer is resistant to consumption by the scribing energy and is generally transmissive to the exposure energy. Additionally, the outer contrast layer can be consumable by the scribing energy, transmissive to the exposure energy, and have a high optical contrast relative to the underlying contrast layer.

In operation, a microelectronic device is fabricated by applying the marking layer so that it is superimposed relative to a surface of the die. The cover layer can be pre-attached to the hidden marking layer such that both the hidden marking layer and the cover layer are applied to the microelectronic device at the same time. The cover layer can alternatively be applied to the hidden marking layer after the hidden marking layer has been deposited onto the device. One embodiment comprises forming a hidden mark in the marking layer by passing a scribing energy through the cover layer to consume a portion of the hidden marking layer. The scribing energy generally does not alter the cover layer such that the hidden mark formed in the marking layer cannot be visually observed. The hidden mark, however, can be identified by exposing the die to an exposure energy that passes through the cover layer, but is at least partially blocked by the marking layer such that the mark formed in the marking layer can be detected.

BRIEF DESCRIPTION OF THE DRAWINGS

FIG. 1 is a cross-sectional view of a marking medium attached to a wafer having a plurality of microelectronic dies in accordance with one embodiment of the invention.

FIG. 2 is a partial cross-sectional view of the marking medium and the wafer of FIG. 1 at one stage of a method for marking microelectronic dies in accordance with one embodiment of the invention.

DETAILED DESCRIPTION

Figure 3:
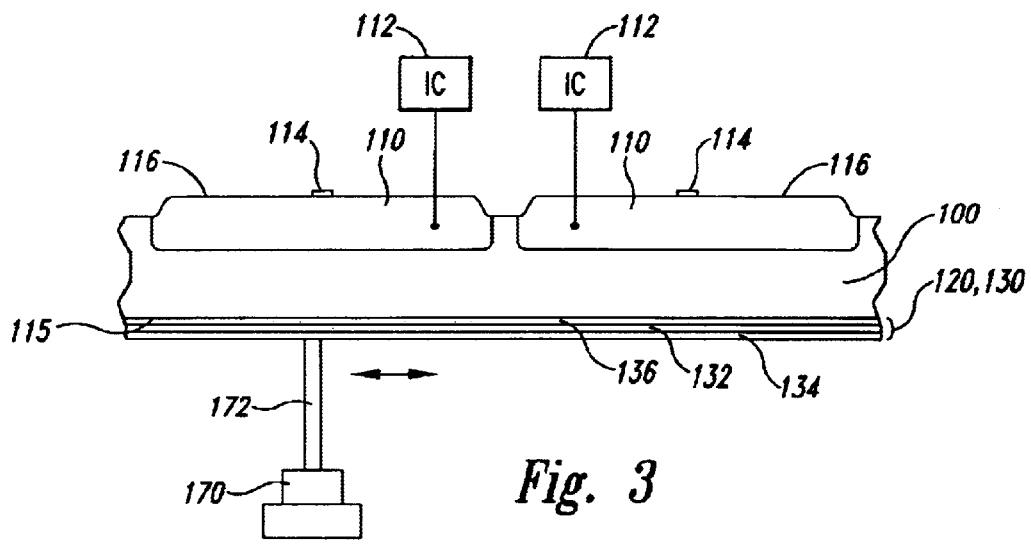
FIG. 3 is a partial cross-sectional view of another stage of the method for marking microelectronic dies in accordance with an embodiment of the invention.

The following disclosure is directed towards devices and methods for marking microelectronic dies, packaged microelectronic dies and other types of microelectronic devices. Many specific details of the invention are described below with reference to microelectronic dies fabricated on a semiconductor wafer to provide a thorough understanding of such embodiments. The present invention, however, can be practiced using other types of microelectronic substrates and also on packaged devices after the dies have been singulated and encapsulated in a package. A person skilled in the art will thus understand that the invention may have additional embodiments, or that the invention may be practiced without several of the details described below.

FIG. 1 is a schematic cross-sectional view of a wafer 100, a plurality of microelectronic dies 110 formed on the wafer 100, and a marking medium 120 applied to the wafer 100 in accordance with one embodiment of the invention. The wafer 100 can be a substrate composed of silicon, glass or other materials that are used in the fabrication of microelectronic dies. The dies 110 are typically formed on a front side of the wafer 100. The dies 110, for example, can be memory devices, microprocessors or other types of microelectronic dies. Each die 110 generally includes an integrated circuit 112 (shown schematically) and an array of contacts 114. The integrated circuit can include transistors, interconnecting circuitry and other components that are formed using a series of deposition, implanting, photolithography, planarizing and other fabrication procedures. The contacts 114 are typically an array of gold or solder bumps on one side of the dies 110 that are electrically coupled to the integrated circuit 112.

The marking medium 120 can be applied to a backside of the wafer 100. The marking medium 120 generally includes a contrast film section 130 and a transfer medium 150. The contrast film section 130 can have one or more contrast films and be adhered to the wafer 100, and the transfer medium 150 can be bonded to the contrast film section 130. Additionally, a carrier ring 160 can be attached to the transfer medium 150 to support the entire assembly of the wafer 100 and the contrast film section 130. The marking medium 120 is generally applied to the wafer 100 after the individual dies 110 have been fabricated. The marking medium 120, however, can be applied to the wafer at other stages of fabricating the microelectronic dies 110. Additionally, the marking medium 120 can have several different embodiments for producing accurate, high-contrast marks on bare microelectronic dies.

FIG. 2 is a partial cross-sectional view illustrating two dies 110 of the wafer 100 and a portion of the marking medium 120 in accordance with an embodiment of the invention. Each die 110 can have a first exterior surface 115 and a second exterior surface 116. The first exterior surface 115 can be the backside of the wafer 100, and the second exterior surface 116 can be discrete portions of the front side of the wafer 100. The array of contacts 114 is generally arranged on the second exterior surface 116 of each die 110. The dies 110 are generally separated by a scribe region 117 that can be scribed or cut to separate the dies 110 on the wafer 100 along a separation plane (shown by a dashed line).

The marking medium 120 of this embodiment includes a contrast film section 130 having an underlying contrast film 132 attached to the first exterior surface 115 of the dies 110 and an outer contrast film 134 attached to the underlying contrast film 132. The underlying contrast film 132 can be applied directly onto the first exterior surface 115 of the dies 110, or the underlying contrast film 132 can be applied to the first exterior surface 115 by an adhesive 136. The transfer medium 150 can be adhered to the outer contrast film 134. The contrast film section 130 and the transfer medium 150 operate to provide a medium that can be manipulated to produce high-contrast marks on each of the microelectronic dies 110.

The contrast films 132 and 134 of the contrast film section 130 generally have contrasting colors and react differently to a selected type of radiation. The underlying contrast film 132 and the outer contrast film 134 have optically contrasting characteristics, such as different colors or different textures. In general, one of the contrast films 132 or 134 has a light color or a reflective or transparent property, and the other of the contrast films 132 or 134 has a dark color or light absorbing/diffusing properties. The underlying contrast film 132 and the outer contrast film 134 can also react differently to a selected radiation such that a portion of the outer contrast film 134 can be selectively removed from the underlying contrast film 132 to create a mark on each die. In one particular embodiment, the underlying contrast film 132 is a white film, and the outer contrast film 134 is a black film. In another embodiment, the underlying contrast film can be a black film and the outer contrast film 134 can be a white film. In still other embodiments, the underlying contrast film 132 can be a color-coded film (e.g., red, blue, yellow, or other colors) and the outer contrast film 134 can be a black film. The underlying contrast film 132 and the outer contrast film 134 can be inks, polymeric sheets or other materials.

The particular colors or materials of the underlying contrast film 132 and the outer contrast film 134 can be selected so that the outer contrast film 134 changes upon exposure to the selected radiation such that a portion of the outer contrast film 134 can be selectively removed from the underlying contrast film 132. For example, when the outer contrast film 134 is a black film and the underlying contrast film 132 is a white film, the black outer contrast film 134 is consumed by a low-power infrared laser having a wavelength of 1,064 nm, but the white underlying contrast film 132 is not noticeably altered by this particular wavelength of infrared radiation. The 1,064 nm laser accordingly consumes a black outer contrast film 134 by selectively removing the black outer contrast film 134, but the 1,064 nm laser does not remove or otherwise consume the white underlying contrast film 132.

The marking medium 120 can be manufactured as a separate device that can be applied to the wafer 100 at the end of the die fabrication process. In one embodiment, the transfer medium 150 is a mounting tape that is commonly used in the singulating process for separating the dies 110 from each other. Suitable mounting tapes for use as the transfer medium 150 are manufactured by 3M corporation of St. Paul, Minn. The outer contrast film 134 can be applied to the transfer medium 150 by drawing the transfer medium 150 through a bath of ink or other type of liquid state material for the outer contrast film 134. The outer contrast film 134 can also be sputtered, screen printed or deposited onto the transfer medium 150 using other techniques. The underlying contrast film 132 can then be formed on the outer contrast film 134 in a similar manner, and an adhesive 136 can be deposited onto the underlying contrast film 132. The marking medium 120 can then be applied to the first exterior surface 115 of the dies 110 by pressing the adhesive 136 against the backside of the wafer 100.

FIG. 2 also illustrates one stage of a method for using the marking medium 120 to create a mark on the dies 110. At this stage, the marking medium 120 is applied to the first exterior surface 115 of the microelectronic dies by adhering the underlying contrast film 132 to the backside of the wafer 100. The marking medium 120 can then be cured to strengthen the bond between the adhesive 136 and the wafer 100. Before curing the marking medium 120, the bond between the wafer 100 and the underlying contrast film 132 formed by the adhesive 136 is preferably weaker than the bond between the outer contrast film 134 and the transfer medium 150. As a result, the marking medium 120 may be tacked onto the wafer 100 and then removed if there are any wrinkles or air pockets between the marking medium 120 and the wafer 100. After curing the marking medium 120, the strength of the bond between the wafer 100 and the underlying contrast film 132 is increased to be greater than the strength of the bond between the outer contrast film 134 and the transfer medium 150. The marking medium 120 may be cured by heating, radiation or merely leaving the marking medium 120 adhered to the wafer 100 for a period of time until the bond between the wafer 100 and the underlying contrast film 132 is greater than the bond between the outer contrast film 134 and the transfer medium 150. The transfer medium 150 can then be peeled from the outer contrast film 134 to leave the contrast film section 130 on the wafer 100.

FIG. 3 illustrates another stage of the method for marking the microelectronic dies 110 using the marking medium 120. At this stage of the method, the adhesive 136 has been cured and the transfer medium 150 has been removed from the contrast film section 130. This stage of the method continues by selectively removing a portion of the outer contrast film 134 from the underlying contrast film 132. In one embodiment, for example, a portion of the outer contrast film 134 can be selectively removed from the underlying contrast film 132 by exposing the portion of the outer contrast film 134 to a selected radiation that consumes (e.g., burns or vaporizes) a discrete, highly-defined section of the outer contrast film 134. In one specific example, the underlying contrast film 132 is a white film, the outer contrast film 134 is a black film, and the selected radiation is a 1,064 nm wavelength infrared beam 172 from a radiation source 170 (e.g., a laser). The infrared beam can be a highly-defined laser that is controlled by a precise X-Y motion device. The laser can be moved at a scan speed of 1,000–5,000 millimeters per second, and the laser can be operated at a power setting as low as 0.5–10 watts. In a particularly useful embodiment, the 1,064 nm wavelength infrared laser has a scan speed of 2,500–3,500 millimeters per second (i.e., 3,000 millimeters per second) and a power setting of 1–4 watts (i.e., 2–3 watts). The 1,064 nm wavelength infrared laser consumes the black outer contrast film 134, but it does not consume the white underlying contrast film 132. As a result, the combination of selecting contrast films in which the selected radiation consumes the outer contrast film at a rate that is greater than it consumes the underlying contrast film, or the laser does not consume the underlying contrast film at all, can produce a high-contrast mark on the first exterior surface 115 of each die 110.

Figures 4A, 4B:
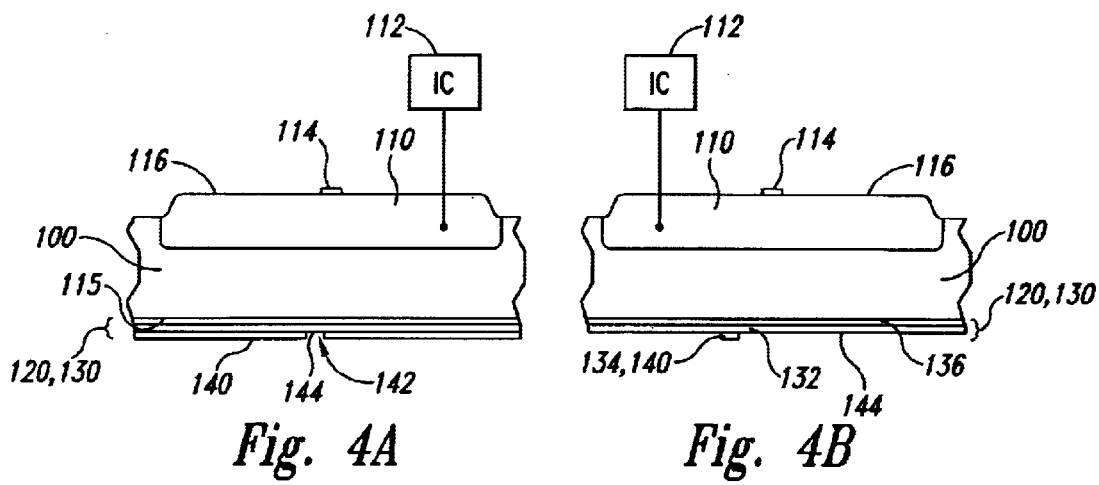
FIGS. 4A–4B are partial cross-sectional views of another stage of a method for marking microelectronic dies in accordance with additional embodiments of the invention.

FIG. 4A illustrates a subsequent stage of marking the microelectronic dies 110 using the marking medium 120. At this stage of the method, a discrete portion of the outer contrast film 134 has been selectively removed from the underlying contrast film 132 to leave a patterned portion 140 of the outer contrast film 134 on the backside 115 of one of the dies 110. In this embodiment, the patterned portion 140 of the outer contrast film 134 has a gap 142 to expose a contrast surface 144 of the underlying contrast film 132. The patterned portion 140 of the outer contrast film and the contrast surface 144 of the underlying contrast film 132 define a mark on the die 110. FIG. 4B illustrates another embodiment of marking the microelectronic die 110 in which a significant portion of the outer contrast film 134 has been removed such that the patterned portion 140 projects above the contrast surface 144 of the underlying contrast film 132. The patterned portion 140 of the outer contrast film 134 and the contrast surface 144 of the underlying contrast film 132 shown in FIG. 4B also define a mark in this embodiment.

The portion of the outer contrast film 134 that is removed to create the patterned portion 140 can be removed using other types of radiation and/or other techniques than the 1,064 nm laser described above. For example, the outer contrast film 132 can be a photo-reactive material (e.g., resist) that changes upon exposure to a selected radiation such that the exposed portion of the outer contrast film becomes either more or less soluble than the unexposed portion of the outer contrast film in a selected solvent. The non-soluble portion of the outer contrast film 134 is then dissolved in the selected solvent to expose the contrast surface 144 of the underlying contrast film 132. The outer contrast film 134 can also be removed by directing a radiation through a mask configured in the shape of the marks. A suitable technique for using a mask and a laser to mark plastics with specific pigments is disclosed in U.S. Pat. No. 4,401,992, which is herein incorporated by reference.

Several embodiments of the marking medium 120 and the method for marking the microelectronic dies 110 are expected to provide high-contrast marks on bare microelectronic dies or packaged microelectronic devices. For example, because the underlying contrast film 132 and the outer contrast film 134 of the marking medium 10 can be made from different colors that have a high optical contrast (e.g., black and white), the resulting mark produced by removing a portion of the outer contrast film 134 has a very distinct, high-contrast. It is expected that machine-vision devices and other processing equipment will be able to correctly identify and efficiently handle bare microelectronic dies or other microelectronic devices that are marked using one of the forgoing embodiments of the marking medium. Therefore, several embodiments of the marking medium 120 and methods for marking the microelectronic dies 110 are expected to improve the efficacy of fabricating and packaging microelectronic dies.

Several embodiments of the marking medium 120 and methods for marking the microelectronic dies 110 are also expected to protect the integrated circuits in the microelectronic dies from being damaged by the marking process. Unlike other laser marking techniques that impinge the die with a laser, the marking medium 120 inhibits or prevents the laser beam from directly contacting the silicon of the microelectronic dies. Additionally, compared to conventional laser marking techniques, several embodiments of the marking method described above can effectively mark bare microelectronic dies using a very low power setting (e.g., less than 10 watts). Therefore, several embodiments of the marking medium 120 and methods for marking the microelectronic dies are expected to inhibit damage to the dies.

Another advantage of several embodiments of the marking medium 120 is that the dies can be identified by a color recognition scheme instead of symbol recognition systems. As explained above, the underlying contrast film 132 of the marking medium 120 can have a particular color that is recognized by a machine-vision device. The color can be selected according to the type of die in the process. For example, a first type of die can be identified using a red underlying contrast film and a second type of die can be identified by using a blue underlying contrast film. If a particular process is for the red type of dies, a machine-vision device can indicate an error message if it senses that a particular die has a blue underlying film. It will be appreciated that such color recognition techniques may be more reliable than symbol recognition techniques because machine-vision equipment may more accurately sense a color than a particular symbol.

Still another advantage of several embodiments of the marking medium 120 and methods for marking the microelectronic dies 110 is that it is expected to be a particularly fast procedure. Unlike conventional laser marking techniques that have a scan velocity of only a few hundred millimeters per second, it is expected that particular embodiments of the marking medium 120 will provide for scan speeds of several thousand millimeters per second. Such higher scan speeds for the laser will reduce the time required for marking each die, and thus several embodiments of the marking medium 120 are expected to increase the throughput of marking microelectronic dies.

Yet another advantage of several embodiments of the marking medium 120 and methods for marking the microelectronic dies 110 is that they do not increase the number of steps for handling and processing microelectronic dies. The marking medium 120 can be substituted for the typical backing tape used in singulating processes and other backend procedures for processing a wafer of microelectronic devices. As such, the foregoing advantages explained above can be achieved without increasing the burden on other aspects of packaging microelectronic dies.

Figure 5:
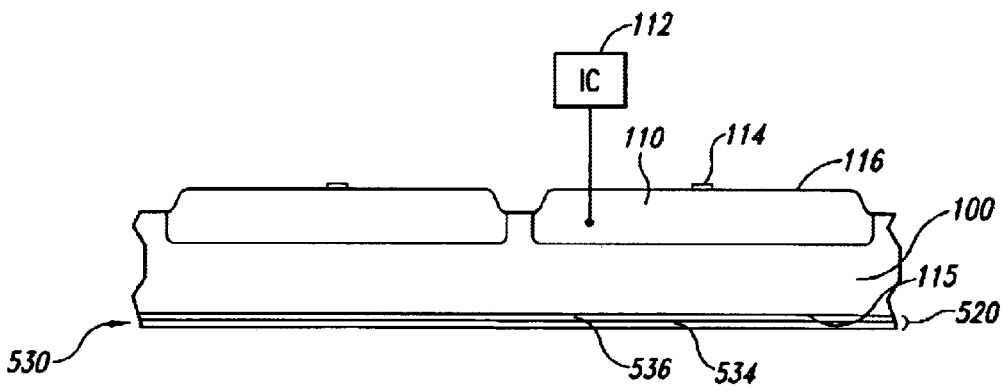
FIG. 5 is a partial cross-sectional view of another marking medium applied to a microelectronic die in accordance with an embodiment of the invention.

FIG. 5 is a partial cross-sectional view illustrating two dies 110 of the wafer 100 and a portion of a marking medium 520 in accordance with another embodiment of the invention. The marking medium 520 includes a contrast film section 530 having a single outer contrast film 534. The outer contrast film 534 can be adhered or bonded to the first exterior surface 115 by an adhesive 536. The outer contrast film 534 generally has a color that has a high optical contrast with respect to the first exterior surface 115 of the dies 110, and the outer contrast film 534 is also selectively removable from the first exterior surface 115 of the microelectronic dies 110. In one particular embodiment, the outer contrast film 534 is a black film that is consumed by an infrared laser beam having a wavelength of approximately 1,064 nm. The marking medium 520 can work in substantially the same manner as the marking medium 120 described above. The marking medium 520, however, is applied to the first exterior surface 115 of the dies 110 without an underlying contrast film. In one embodiment for making the marking medium 520, the adhesive 536 is deposited onto the backside of the wafer 100, and then the outer contrast film 534 is deposited onto the adhesive 536. The outer contrast film 534 and the adhesive 536, for example, can be deposited using sputtering techniques, screen printing processes or other methods known in the semiconductor and the printing arts. In another embodiment for making the marking medium 520, the outer contrast film 534 and the adhesive 536 are formed on a transfer medium (not shown) and then applied to the backside of the wafer 160. When a portion of the outer contrast film 534 is removed, the silver mirror-like exterior surface 115 is optically distinguishable from the remaining portion of the outer contrast film 534.

Figure 6:
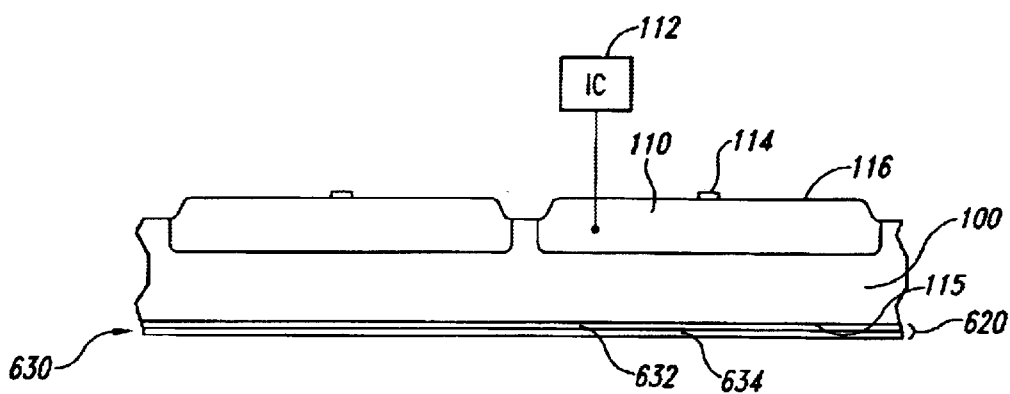
FIG. 6 is a partial cross-sectional view of still another marking medium applied to a microelectronic die in accordance with an embodiment of the invention.

FIG. 6 is a schematic, cross-sectional view illustrating a die 110 of the wafer 100 and a portion of a marking medium 620 in accordance with yet another embodiment of the invention. In this embodiment, the marking medium 620 includes a contrast film section 630 having an underlying contrast film 632 and an outer contrast film 634. The underlying contrast film 632 is applied directly to the first exterior surface 116 of the dies 110, and the outer contrast film 634 is applied directly to the underlying contrast film 632. The marking medium 620 does not include a transfer medium. The underlying contrast film 632 and the outer contrast film 634, however, can be the same as those as described above with respect to the marking medium 120. In operation, the underlying contrast film 632 and the outer contrast film 634 can be applied using sputtering techniques, screen printing techniques, or other processes known in the semiconductor and printing arts.

Figure 7:
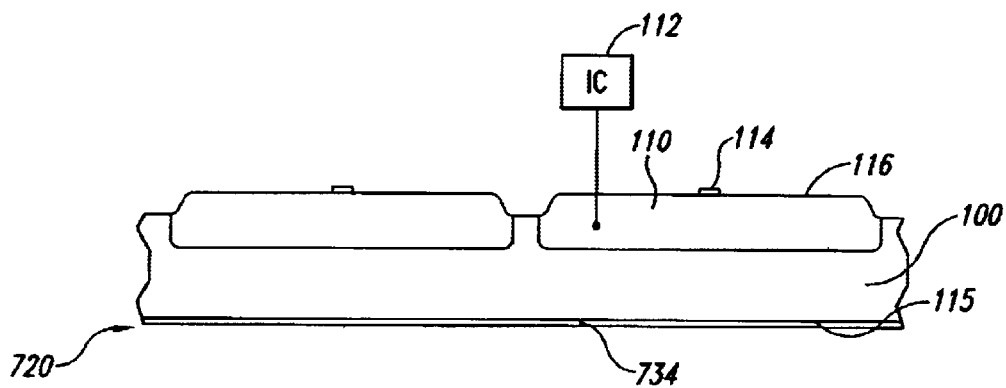
FIG. 7 is a partial cross-sectional view of yet another marking medium applied to a microelectronic die in accordance with yet another embodiment of the invention.

FIG. 7 is a partial cross-sectional view illustrating a die 110 of the wafer 100 and a portion of a marking medium 720 in accordance with still another embodiment of the invention. In this embodiment, the marking medium 720 has a single-layer outer contrast film 734 applied directly to the first exterior surface of the die 110. The outer contrast film 734 can be sputtered or screen printed onto the first exterior surface 115 of the microelectronic die 110. The outer contrast film 734 is selected to have a high-contrast color with respect to the first exterior surface 115 of the microelectronic die 110, and the outer contrast film 734 is composed of a material that can be readily consumed by a laser or other source of radiation. In operation, a portion of the outer contrast film 734 is exposed to the selected radiation to remove that portion of the outer contrast film 734 from the backside of the wafer 100. In a particular example, the outer contrast film 734 is a black film applied to the first exterior surface 115 of the die 110, and then an infrared laser having a wavelength of 1,064 nm consumes a portion of the outer contrast film 734 in a pattern corresponding to the marks. The exposed portions of the first exterior surface 115 have a mirror-like optical property compared to the black surface of the remaining portion of the outer contrast film 734.

Figure 8:
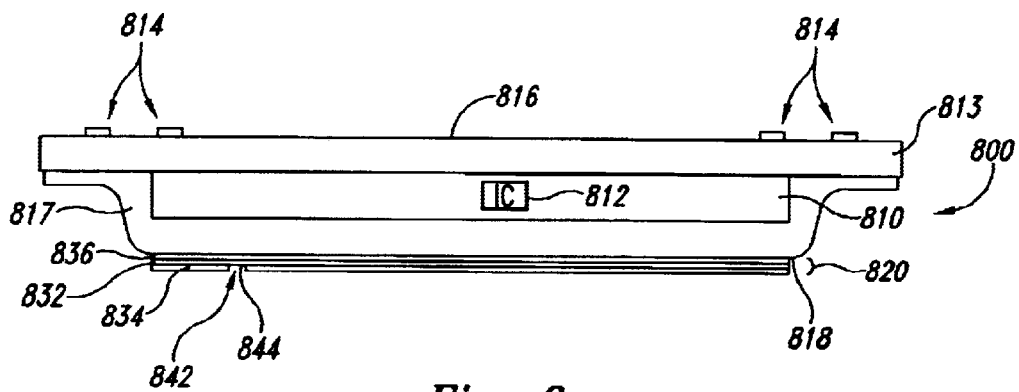
FIG. 8 is a partial cross-sectional view of a marking medium applied to a packaged microelectronic device in accordance with an embodiment of the invention.

FIG. 8 is a schematic cross-sectional view of a packaged microelectronic device 800 having a marking medium 820 in accordance with another embodiment of the invention. In this embodiment, the packaged device 800 includes a microelectronic die 810 having an integrated circuit 812, and a substrate 813 having a plurality of contacts 814 formed in an array. The contacts 814, for example, can be solder ball pads for a ball-grid array. The integrated circuit 812 of the microelectronic die 810 is electrically coupled to the contacts 814 of the contact array. The microelectronic device 800 also includes a covering 817 encapsulating the microelectronic die 810. The covering 817 can have a flat surface 818 defining the first exterior surface of the microelectronic device 800, and the substrate 813 can have a surface 816 defining the second exterior surface of the microelectronic device 800.

The marking medium 820 can be any of the marking mediums 120–720 explained above with reference to marking a bare microelectronic die 110. In the particular embodiment shown in FIG. 8, the marking medium 820 has a first underlying contrast film 832 attached to the first exterior surface 818 of the covering 817 by an adhesive 836. The marking medium 820 can further include an outer contrast film or layer 834 bonded to the underlying contrast film 832. A portion of the outer contrast film 834 can be selectively removed from the underlying contrast film 832 to form a gap 842 for exposing a contrast surface 844 of the underlying contrast film 832. The portion of the outer contrast film 834 can be selectively removed using any of the techniques explained above with respect to FIGS. 1–7.

Figure 9:
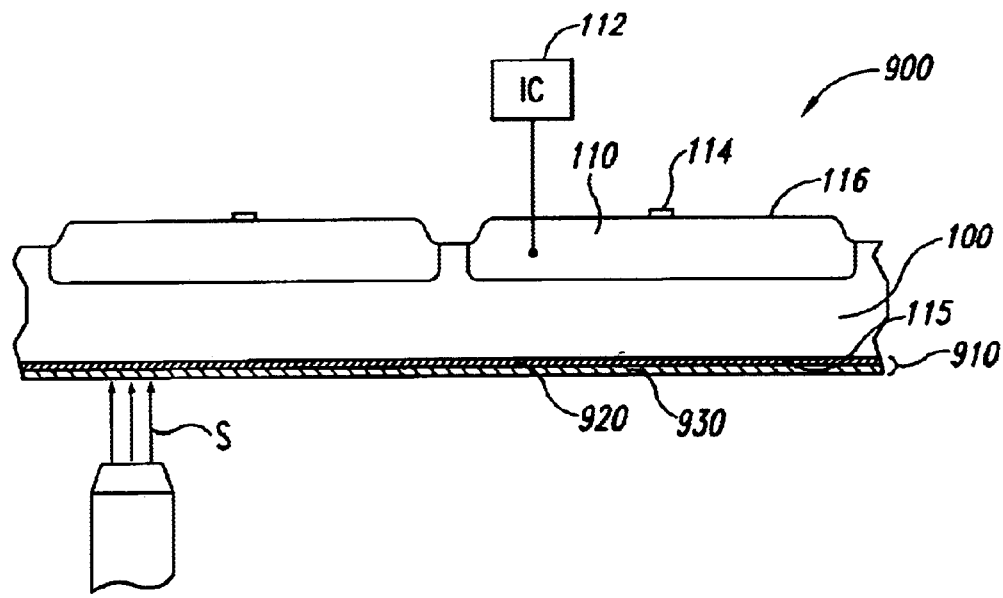
FIG. 9 is a partial cross-sectional view of a marking medium applied to a packaged microelectronic device in accordance with another embodiment of the invention for identifying genuine components.

FIG. 9 is a cross-sectional view of a microelectronic device 900 having a microelectronic substrate 100 with a plurality of microelectronic dies 110. Each of the microelectronic dies 110 can include an integrated circuit 112 and an array of contacts 114. The dies 110, more specifically, can have a first exterior surface 115 (i.e., a backside) that is generally inactive and a second exterior surface 116 (i.e., a front side) where the array of contacts 114 is located. The microelectronic dies 110 can be the same or at least substantially similar to those described above with reference to FIGS. 1–8, and thus like reference numbers refer to like components in FIGS. 1–9.

The microelectronic device 900 can also include a marking medium 910 applied to either the first exterior surface 115 of the die 110 or a package (not shown in FIG. 9) that encapsulates at least a portion of the die 110. The marking medium 910 can include an underlying layer or marking layer 920 and a cover layer 930 over the marking layer 920. The cover layer 930 accordingly hides the marking layer 920 from visual observation. As explained above with reference to FIG. 1, one embodiment of the marking medium 910 is applied to the substrate 100 after the individual dies 110 have been fabricated. The marking layer 920, for example, can be deposited onto the first exterior surface 115 and then the cover layer 930 can be deposited onto the marking layer 920. In an alternate embodiment, the marking layer 920 and the cover layer 930 are fabricated as a separate tape or film that is applied to the substrate 100 as a combined unit. Suitable techniques for either applying the marking layer 920 and the cover layer 930 separately or as a combined film can be accomplished as explained above with reference to the contrast films 132 and 134.

The marking layer 920 defines a hidden layer to the extent that at least a portion of the cover layer 930 hides a portion of the marking layer 920. The marking layer 920 has a first response to an exposure energy, such as a first opacity that blocks at least a detectable percentage of the exposure energy or a first reflectivity that reflects or generally absorbs the exposure energy. One specific embodiment of the marking layer is a material that is generally opaque to x-rays or low-intensity infrared radiation, and/or reflective or non-reflective to ultrasonic energy. Suitable materials having a sufficient response characteristic to x-ray, low-intensity infrared radiation, and ultrasonic energy include aluminum and other selected metals. In the case of aluminum, a thin layer of aluminum can be deposited onto the backside 115 of the substrate 110 using known chemical-vapor deposition procedures. The material of the marking layer 920 can also be displaced, such as by being consumed or moved, by a scribing energy that is different from the exposure energy. For the purposes of the present disclosure, displacement of the marking layer 920 can be moving a portion of the marking layer or consuming a portion of the marking layer 920. For example, when the marking layer 920 is an aluminum layer, the scribing energy can be a laser having a wavelength of 1,064 nm. The scribing energy, however, can have a wavelength of 532 nm or any other suitable wavelengths that can displace the material of the marking layer 920.

The cover layer 930 is an outer layer and/or an intermediate layer that has a second response characteristic to the exposure energy that is different than the first response characteristic of the marking layer 920. The cover layer 930, for example, can have a second opacity that is less than the first opacity of the marking layer 920 so that less of the exposure energy penetrates through the marking layer 920 than the cover layer 930. The material of the cover layer 930 can also be resistant to being displaced by the scribing energy. The cover layer 930, for example, can be an ink or other material that is not visibly altered by the scribing energy. One particular embodiment of the microelectronic device 900 includes a cover layer 930 formed from a white ink that is transmissive to x-ray, low-intensity infrared radiation and/or ultrasonic energy and is not consumed by a scribing energy having a wavelength of 1,064 nm. Other embodiments of cover layers are not consumed by radiation having a wavelength of 532 nm or other wavelengths that consume the marking layer 920. One embodiment of the marking medium 910 accordingly includes an aluminum marking layer 920 and a white ink cover layer 930.

FIG. 9 also shows a stage of marking the microelectronic device 900 to form a hidden mark in the marking layer 920. In the embodiment shown in FIG. 9, the marking layer 920 and the cover layer 930 are both applied to the substrate 100 before forming a hidden mark in the marking layer 920. A scribing energy S is then directed toward the cover layer 930. The scribing energy S penetrates through cover layer 930 because the cover layer 930 is at least partially transmissive to the scribing energy S. The portion of the scribing energy S that passes through the cover layer 930 displaces or otherwise consumes at least a portion of the marking layer 920 aligned with the scribing energy S. In an alternate embodiment, the marking layer 920 is deposited on the die and the scribing energy S is directed against only the marking layer 920 before the cover layer 930 is deposited onto the marking layer 920. The cover layer 930 in this alternate embodiment accordingly does not need to be a material that is resistant to consumption or displacement by the scribing energy. The scribing energy S accordingly removes a portion of the marking layer 920 to form an identification mark, and the cover layer 930 conceals at least a portion of the marking layer 920 either before or after forming the identification mark to hide the identification mark.

The scribing energy S can be an energy beam that is moved to form the design of the hidden mark. In an alternate embodiment, the scribing energy S can pass through a mask aligned with the microelectronic device 900 using photolithographic techniques that are known in the semiconductor manufacturing arts. It will be appreciated that the pattern for applying the scribing energy S is selected to provide the desired design for the hidden mark in the marking layer 920. In certain applications, the designs for the hidden marks can be codes that are associated with certain lots of dies, and some features embedded in the dies can be coded to correspond to the code of the hidden marks.

Figure 10:
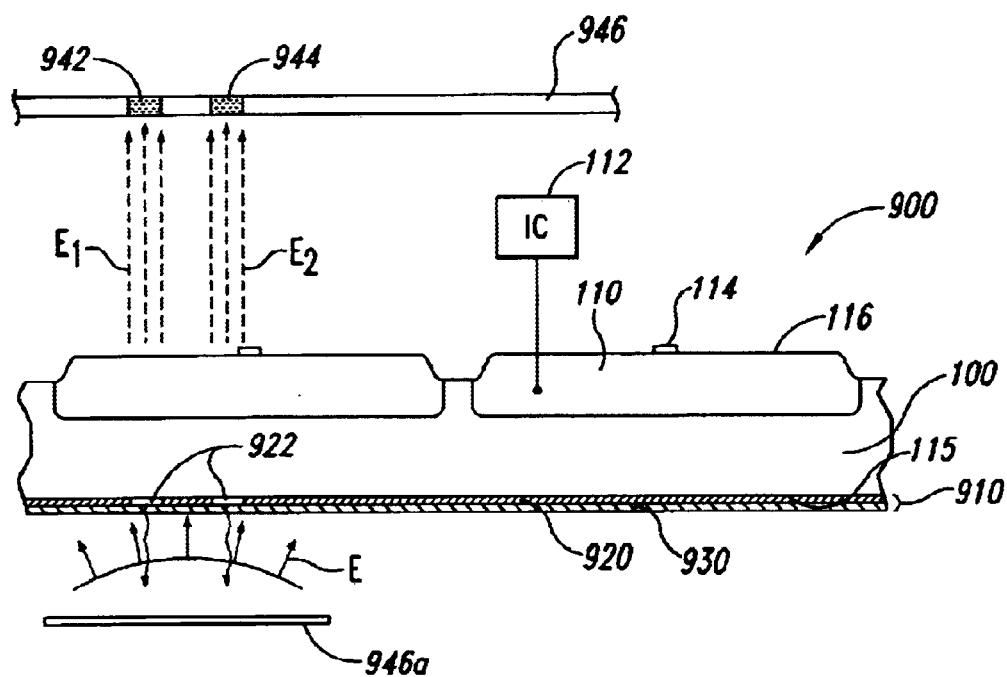
FIG. 10 is a partial cross-sectional view of the packaged microelectronic device of FIG. 9 shown at a different stage of an embodiment for identifying genuine components.

FIG. 10 illustrates the microelectronic device 900 after a hidden mark 922 has been formed in the marking layer 920. The hidden mark 922 is defined by one or more depressions in the marking layer 920. The depression defining the hidden mark 922 is the portion of the marking layer 920 that was consumed by the scribing energy S (FIG. 9). In one aspect of the embodiment shown in FIG. 10, the depression defining the hidden mark 922 is a void that passes completely through the marking layer 920. An alternate embodiment of the hidden mark 922 is defined by a depression that has a thinned portion of the marking layer 920 remaining on the substrate 100 after using the scribing energy. In either case, whether the depression is a complete void or merely a thinned portion of the marking layer 920, the hidden mark 922 allows more of an exposure energy E to pass through the hidden mark 922 than the adjacent portion of the marking layer 920. The unscribed portions of the marking layer 920 accordingly block more of the exposure energy E than the area of the hidden mark 922.

In operation, a genuine component can be identified by exposing the microelectronic device 900 to a selected exposure energy E that penetrates through the cover layer 930. In the case of x-ray or infrared radiation, for example, the exposure energy E can pass through the hidden mark 922 to form a first high intensity area of exposure energy $E_1$ and a second high intensity area of exposure energy $E_2$. The pattern of the high intensity areas $E_{1\text{-}2}$ form a pattern of irradiated areas 942 and 944 on a detector 946. When the irradiated pattern corresponds to the hidden mark 922, then the microelectronic device 900 can be confirmed as a genuine component. This embodiment works well in situations in which the die 110 does not have components that would block the radiation from reaching the detector 946. In the case of using ultrasonic energy as the exposure energy, a detector 946a on the other side of the substrate 100 can detect the difference in the reflection of the ultrasonic energy off of the marking layer and the area exposed by the marking layer.

Several embodiments of the microelectronic device 900 are expected to reduce or at least deter the passing-off of counterfeit parts as genuine parts. Moreover, embodiments of the microelectronic device 900 that have a sophisticated pattern of marks coded for particular lots of dies are expected to further enhance the ability to identify counterfeit parts. The hidden marks, moreover, can be placed on the microelectronic devices without cluttering or obfuscating visual marks on the finished packages that are necessary for automatic vision-handling equipment. As a result, the hidden marks are expected to be difficult to copy by counterfeiters, which is expected to deter the proliferation of counterfeit parts.

Additionally, by providing hidden marks that cannot be observed visually, several embodiments of the microelectronic devices are expected to increase the revenues and reduce the costs for genuine part manufacturers. The revenues of genuine part manufacturers should be increased because the deterrence of the hidden security marks should reduce the market share that counterfeiters take away from genuine part manufacturers. The genuine part manufacturers can also reduce costs by identifying counterfeit parts submitted for warranty claims. Moreover, providing hidden marks is also expected to enhance the ability to enforce regulations against passing-off to further deter counterfeiters from producing counterfeit parts.

Figure 11:
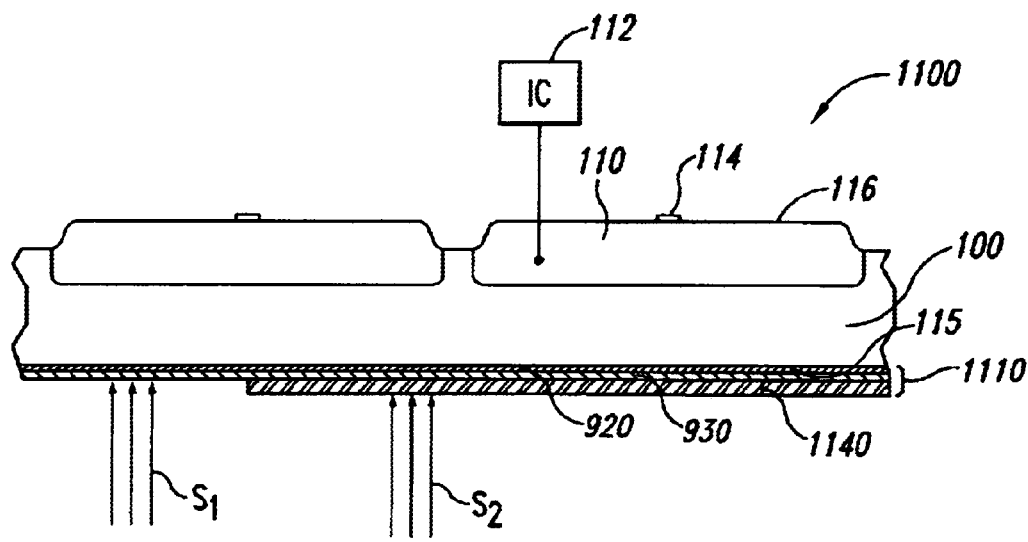
FIG. 11 is a partial cross-sectional view of a marking medium applied to a packaged microelectronic device in accordance with still another embodiment of the invention for identifying genuine components.

FIG. 11 is a cross-sectional view illustrating a microelectronic device 1100 in accordance with another embodiment of the invention. The microelectronic device 1100 includes several of the same components as the microelectronic device 900 described above with reference to FIGS. 9 and 10. Thus, like reference numbers refer to like components in FIGS. 1–11.

The microelectronic device 1100 has a marking medium 1110 including the marking layer 920, the cover layer 930, and an outer layer or film 1140. The marking layer 920 and the cover layer 930 can be similar or even identical to those described above with reference to FIGS. 9 and 10. The cover layer 930, however, is an intermediate layer that defines an underlying contrast film; the outer layer 1140 can accordingly define an outer contrast film on the underlying contrast film (i.e., the cover layer 930). The outer contrast film 1140 can cover all of the cover layer 930, or as shown in FIG. 11, it can cover only a portion of the cover layer 930. One embodiment of the outer contrast film 1140 is a material that is consumable by the scribing energy S and transmissive to the exposure energy E. Alternate embodiments of the outer contrast film 1140, however, may be resistant to being consumed by the scribing energy S that is used to remove the portions of the marking layer 920. In such alternate embodiments of the outer contrast film 1140, the outer contrast film 1140 can be removed using a different type of scribing energy, etching, or even other techniques. The outer contrast film 1140 also typically has an optical contrast relative to the cover layer 930. When the cover layer 930 is white, for example, the outer layer contrast film 1140 can be black or another relatively dark color (e.g., blue, green, brown, red, etc.) to provide a visible, high-contrast mark on the surface of the microelectronic device.

Figure 12:
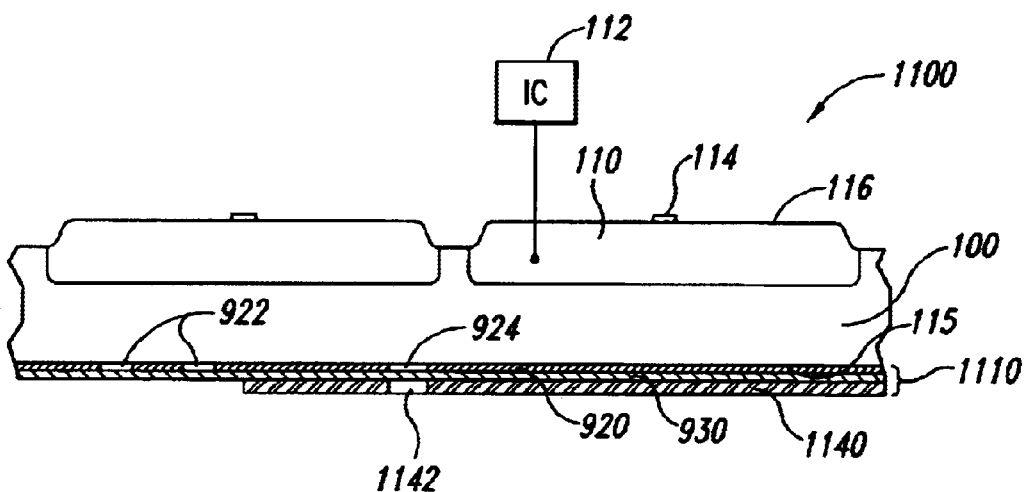
FIG. 12 is a partial cross-sectional view of the microelectronic device of FIG. 11 shown at a different stage of forming a hidden mark and a visual mark in accordance with an embodiment of the invention.

FIG. 12 illustrates one embodiment of the microelectronic device 1100 after a hidden mark 922 has been formed in the marking layer 920 and a visible mark 1142 has been formed in the outer contrast film 1140. In this particular embodiment, a second hidden mark 924 is formed under the visible mark 1142 because the marking layer 920 and the outer contrast film 1140 are both made from materials that are consumed by a common scribing energy. In alternate embodiments, it will be appreciated that the marking layer 920 and the outer contrast film 1140 can be consumed by different scribing energies such that a hidden mark 922 can be formed in the marking layer 920 under an area of the cover layer 930 that is also covered by the outer contrast film 1140. For example, the hidden mark 922 can be formed using a first scribing energy $S_1$ that consumes the material of the marking layer 920, and the visible mark 1142 can be formed using a second scribing energy $S_2$ that consumes the material of the outer contrast film 1140. The microelectronic device 1100 can thus have the hidden mark 922 in the marking layer 920 and the visible mark 1142 defined by the contrast between the cover layer 930 and the outer contrast film 1140.

From the foregoing it will be appreciated that several specific embodiments of the invention have been described herein for purposes of illustration, but that various modifications may be made without deviating from the spirit and scope of the invention. The underlying contrast film, for example, can have several different colors so that different exposed surfaces of the underlying contrast film perform different functions. Accordingly, the invention is not limited except as by the appended claims.

What is claimed is:

1. A microelectronic device, comprising:
   a microelectronic die having an integrated circuit; and
   a marking medium on the die having a marking layer and a cover layer over the marking layer, the marking layer having a first opacity to an exposure energy and the marking layer being consumable by a scribing energy, the cover layer having a second opacity to the exposure energy that is less than the first opacity and the cover layer being resistant to being consumed by the scribing energy, and wherein the marking medium further includes a hidden mark under the cover layer defined by a depression in the marking layer through which at least a portion of the exposure energy can pass.

2. The microelectronic device of claim 1 wherein the marking layer comprises aluminum.

3. The microelectronic device of claim 1 wherein the cover layer comprises a white ink.

4. The microelectronic device of claim 1 wherein:

the marking layer comprises aluminum; and the cover layer comprises a white ink.

5. The microelectronic device of claim 1 wherein the depression comprises a void extending completely through the marking layer.

6. The microelectronic device of claim 1, further comprising an outer contrast layer on the cover layer and a void through the outer contrast layer that defines a visible mark.

7. The microelectronic device of claim 1 wherein:

the marking layer comprises aluminum;

the cover layer comprises a white ink; and the device further comprises an outer contrast layer on the cover layer and a void through the outer contrast layer that defines a visible mark.

8. A microelectronic device, comprising:

a microelectronic die having an integrated circuit;

a package covering at least a portion of the die;

a marking layer on a surface of the die and/or a surface of the package, the marking layer having a first opacity to an exposure energy and the marking layer being consumable by a scribing radiation, wherein the marking layer has a depression defining a hidden mark; and a cover layer over at least the depression in the marking layer, the cover layer having a second opacity that is less than the first opacity and the cover layer being resistant to being consumed by the scribing energy.

9. The microelectronic device of claim 8 wherein the marking layer comprises aluminum.

10. The microelectronic device of claim 8 wherein the cover layer comprises a white ink.

11. The microelectronic device of claim 8 wherein:

the marking layer comprises aluminum; and the cover layer comprises a white ink.

12. The microelectronic device of claim 8 wherein the depression comprises a void extending completely through the marking layer.

13. The microelectronic device of claim 8, further comprising an outer contrast layer on the cover layer and a void through the outer contrast layer that defines a visible mark.

14. The microelectronic device of claim 8 wherein:

the marking layer comprises aluminum;

the cover layer comprises a white ink; and the device further comprises an outer contrast layer on the cover layer and a void through the outer contrast layer that defines a visible mark.

15. A microelectronic device, comprising:

a microelectronic die having an integrated circuit;

a marking layer on a surface of the die, the marking layer having a first opacity to an exposure energy, and wherein the marking layer has a depression defining an identification mark; and a cover layer over at least the depression, the cover layer having a second opacity less than the first opacity.

16. The microelectronic device of claim 15 wherein the marking layer comprises aluminum.

17. The microelectronic device of claim 15 wherein the cover layer comprises a white ink.

18. The microelectronic device of claim 15 wherein:

the marking layer comprises aluminum; and the cover layer comprises a white ink.

19. The microelectronic device of claim 15 wherein the depression comprises a void extending completely through the marking layer.

20. The microelectronic device of claim 15, further comprising an outer contrast layer on the cover layer and a void through the outer contrast layer that defines a visible mark.

21. The microelectronic device of claim 15 wherein:

the marking layer comprises aluminum;

the cover layer comprises a white ink; and the device further comprises an outer contrast layer on the cover layer and a void through the outer contrast layer that defines a visible mark.

22. The microelectronic device of claim 15 wherein the marking layer further comprises a material that is consumable by a scribing energy used to form the depression in the marking layer.

23. The microelectronic device of claim 15 wherein the cover layer further comprises a material that is resistant to consumption by a scribing energy used to form the depression in the marking layer.

24. The microelectronic device of claim 15 wherein:

the marking layer further comprises a material that is consumable by a scribing energy used to form the depression in the marking layer; and the cover layer further comprises a material that is resistant to consumption by a scribing energy used to form the depression in the marking layer.

25. A microelectronic device, comprising:

a microelectronic die having an integrated circuit;

a hidden marking layer superimposed relative to a surface of the die, the marking layer being consumable by a scribing energy and opaque to an exposure energy, wherein the marking layer has a depression through which at least a portion of the exposure energy can pass;

an underlying contrast film over the marking layer, the underlying contrast film being resistant to consumption by the scribing energy and transmissive to the exposure energy; and an outer contrast film on the underlying contrast film, the outer contrast film being consumable by the scribing energy and transmissive to the exposure energy.

26. The microelectronic device of claim 25 wherein the marking layer comprises aluminum.

27. The microelectronic device of claim 25 wherein the cover layer comprises a white ink.

28. The microelectronic device of claim 25 wherein:

the marking layer comprises aluminum; and the cover layer comprises a white ink.

29. The microelectronic device of claim 25 wherein the depression comprises a void extending completely through the marking layer.

30. The microelectronic device of claim 25, further comprising an outer contrast layer on the cover layer and a void through the outer contrast layer that defines a visible mark.

* * * * *